(12) United States Patent
Ikegami

(10) Patent No.: US 7,323,354 B2
(45) Date of Patent: Jan. 29, 2008

(54) METHOD OF MANUFACTURING MEMS DEVICE

(75) Inventor: Naokatsu Ikegami, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 352 days.

(21) Appl. No.: 10/995,406

(22) Filed: Nov. 24, 2004

(65) Prior Publication Data

US 2005/0236682 A1 Oct. 27, 2005

(30) Foreign Application Priority Data

Apr. 21, 2004 (JP) ............................. 2004-125853

(51) Int. Cl.
*H01L 21/00* (2006.01)
(52) U.S. Cl. ............................. 438/50; 438/48; 438/52
(58) Field of Classification Search .................. 438/50, 438/52, 48
See application file for complete search history.

(56) References Cited

U.S. PATENT DOCUMENTS

| | | | | |
|---|---|---|---|---|
| 6,730,535 B2 * | 5/2004 | Morimoto et al. | ............ | 438/50 |
| 7,071,017 B2 * | 7/2006 | Suzuki | .................. | 438/52 |
| 2005/0032266 A1 * | 2/2005 | Suzuki | .................. | 438/50 |
| 2005/0079648 A1 * | 4/2005 | Hou | ..................... | 438/53 |
| 2005/0236682 A1 * | 10/2005 | Ikegami | ................ | 257/415 |
| 2007/0042524 A1 * | 2/2007 | Kogut et al. | ............ | 438/52 |

FOREIGN PATENT DOCUMENTS

| | | |
|---|---|---|
| JP | 5-55534 | 3/1993 |
| JP | 7-225240 | 8/1995 |
| JP | 8-125121 | 5/1996 |
| JP | 9-15257 | 1/1997 |

\* cited by examiner

*Primary Examiner*—Laura M. Schillinger
(74) *Attorney, Agent, or Firm*—Volentine & Whitt, P.L.L.C.

(57) ABSTRACT

The present invention provides a method of manufacturing MEMS devices, comprising the steps of forming MEMS device bodies in a first substrate, defining concave portions around the MEMS device bodies over the first substrate, forming convex portions coincident with the concave portions in a second substrate, fitting the convex portions in the concave portions, respectively, to join the first substrate and the second substrate to each other, thereby forming a third substrate, sticking the third substrate to a UV sheet on the second substrate side, and dicing the third substrate to separate the MEMS device bodies from one another.

7 Claims, 7 Drawing Sheets

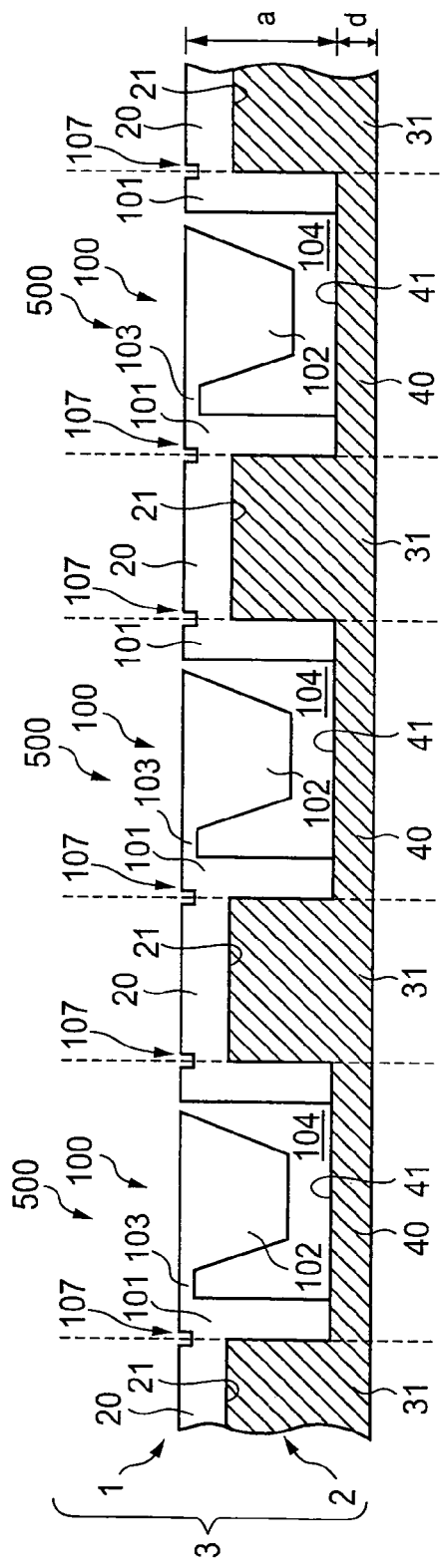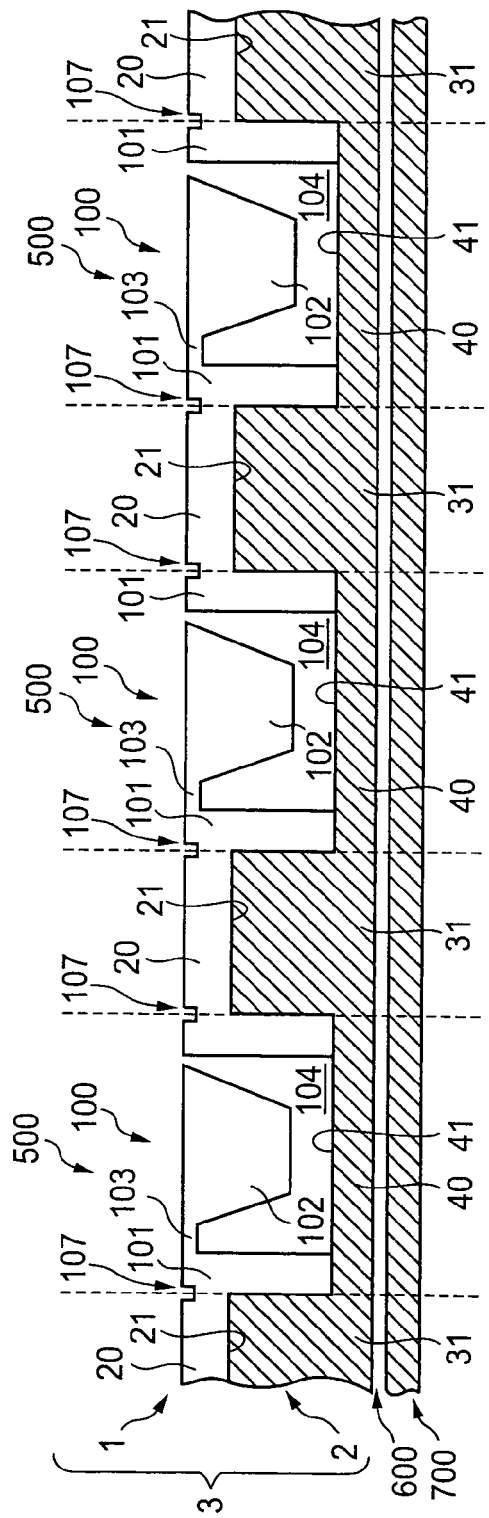

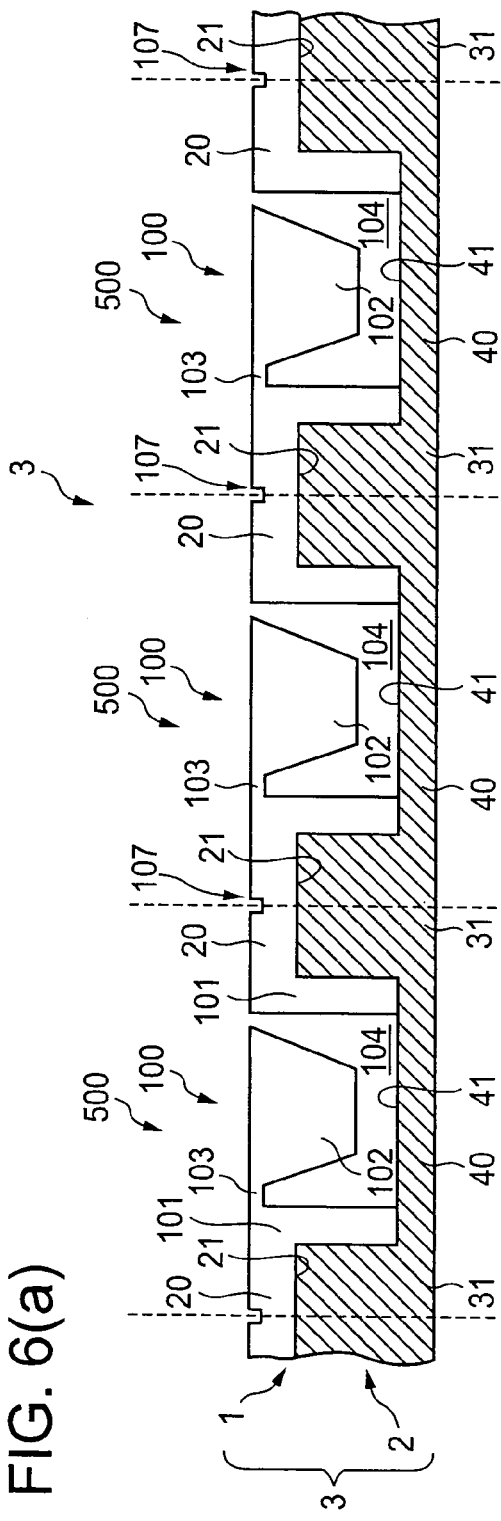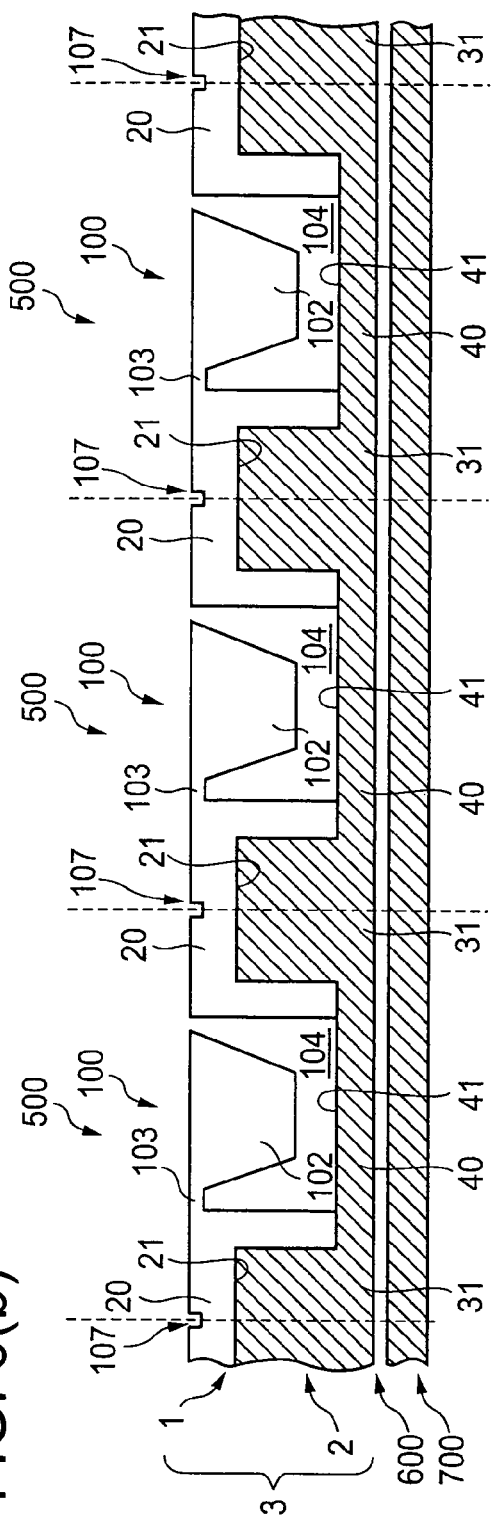

METHOD OF MANUFACTURING MEMS DEVICE

BACKGROUND OF THE INVENTION

1. Field of the Invention

The present invention relates to a method of manufacturing an MEMS (Micro Electrical Mechanical System) device.

2. Description of the Related Art

A micro machining technology that applies a semiconductor micro-fabrication technique is capable of manufacturing a micro structure of a few 100 μm or so. The application of such a technology to various sensors, an optical switch, RF parts, etc. has been discussed. Since a device based on such a micro machining technology is manufactured using a silicon process, the device can be integrated on a chip together with a signal processing system LSI, and a system having a specific function can be constructed on the chip. Such a device is called "MEMS (Micro Electrical Mechanical System) device".

A conventional MEMS device has been described in, for example, patent documents 1 (Japanese Unexamined Patent Publication No. Hei 9(1997)-15257) and 2 (Japanese Unexamined Patent Publication No. Hei 7(1995)-225240).

Acceleration sensors formed by laminating first and second silicon substrates on each other have been described in the patent document 1. Each of the acceleration sensors has a square-shaped frame (peripheral portion) having an opening, a weight portion disposed in the opening formed inside the frame, and beam portions that elastically support the weight portion at the peripheral portion.

Acceleration sensors each formed integrally with a silicon substrate (device substrate) by a semiconductor manufacturing process have been described in the patent document 2. The acceleration sensor has a frame (peripheral portion) having an opening, a weight portion disposed in the center of the opening, and two beams that support the weight portion elastically and in cantilever manner on the frame. The two beams support the weight portion at the peripheral portion on the upper surface side of the peripheral portion. The lower surface of the acceleration sensor is fixed to a cover (cap substrate) having a thickness substantially identical to that of the acceleration sensor. The cap substrate is laminated on the device substrate formed with such acceleration sensors, followed by being fixed to an UV sheet with an adhesive, and the respective acceleration sensors are separated by dicing.

An example illustrative of the bonding of the substrates to each other in the semiconductor manufacturing process as described in each of the patent documents 1 and 2 has been described in, for example, patent documents 3 (Japanese Unexamined Patent Publication No. Hei 5(1993)-55534) and 4 (Japanese Unexamined Patent Publication No. Hei 8(1996)-125121).

A laminated semiconductor device in which a first SOI substrate and a second SOI substrate are bonded to each other, has been described in the patent document 3. The first SOI substrate has a first device layer and a contact portion formed on the first device layer. The second SOI substrate has a second device layer and an SOG (Spin On Glass) film formed on the second device layer. A concave portion fitted in the contact portion is formed in the SOG film. In the semiconductor device, the first SOI substrate and the second SOI substrate are joined to each other in a state in which the contact portion is being fitted in the concave portion of the SOG film, thereby to achieve electrical contact between the first device layer and the second device layer.

A semiconductor device in which a first semiconductor substrate and a second semiconductor substrate are joined to each other, has been described in the patent document 4. Each of the first and second semiconductor substrates includes a transistor, electrodes potentially connected to the transistor via an interlayer insulating film, and an insulating film formed in a gap between the adjacent electrodes. Concavo-convex patterns sawtooth as viewed in section are formed in the electrodes and the insulating film of the first semiconductor substrate. Concavo-convex patterns 180° out of phase with the concavo-convex patterns of the first semiconductor substrate are formed in the electrodes and the insulating film of the second semiconductor substrate. In the present semiconductor device, the first and second semiconductor substrates are bonded to each other in a state in which the concavo-convex patterns of the first and second semiconductor substrates are being engaged with one another, whereby electrical contacts between the transistors of the respective semiconductor substrates are made.

Since the openings of the frames extend through the first and second substrates in the acceleration sensors described in the patent document 1, the following problems occur upon fractionization of the acceleration sensors by dicing. Firstly, there is a possibility that the characteristic of each acceleration sensor will be deteriorated due to the intrusion of the residual of silicon into the acceleration sensor upon dicing. Secondly, there may be a case in which when the acceleration sensors are directly adhered to the UV sheet, the adhesive is attached to the weight portions, and when the fractionalized acceleration sensors are picked up, the weight portions are not separated from the UV sheet with ease. In such a case, there is a possibility that the beam portions will break down due to the application of excessive stress to the beam portions that support the weight portions. Thirdly, there is a possibility that the thin beam portions will be broken due to pressure of wafer for sweeping or discharging the residual of silicon upon dicing.

Since the cap substrate is bonded to the device substrate and thereafter dicing is done in the acceleration sensors described in the patent document 2, the acceleration sensors are covered with the cap substrate. Thus, the first through third problems can be resolved. That is, since the acceleration sensors are covered with the cap substrate, it is possible to prevent the residual of silicon from being intruded into the acceleration sensors upon dicing, prevent the adhesive from adhering to the weight portions of the acceleration sensors and prevent damage of the beam portions due to the water pressure.

However, the cap substrate needs a film thickness for maintaining a hand ring strength at the time that it is handled as singular or discrete. The cap substrate normally needs a thickness substantially identical to the silicon substrate. As a result, there is a possibility that the thickness of each acceleration sensor will increase due to the bonding of the cap substrate to the device substrate. When the acceleration sensor is mounted to a small-sized device such as a cellular phone, the space required for assembly in the device is restricted and hence the thickness of an acceleration sensor chip is restricted. A cellular phone, which is now ubiquitous, needs to have a chip thickness of 1.2 mm or less as the post-assembly chip thickness. Thus, it is not possible to ignore an increase in the thickness due to the bonding of the cap substrate to the device substrate.

The laminating of the substrates on each other, which has been described in each of the cited documents 3 and 4, is equivalent to such a configuration as to join the substrates to make contact between adjacent devices of the respective substrates. This is not intended for one that pays attention to the problem that the post-bonding substrate becomes thick due to the thickness of the cap substrate. That is, the structure described in each of the cited documents 3 and 4 is of a structure in which substrates each having substantially the same thickness are bonded to each other. A post-bonding substrate is substantially twice as thick as a discrete substrate.

SUMMARY OF THE INVENTION

With the foregoing in view, it is an object of the present invention to reduce the thickness of an MEMS device while ensuring a hand ring strength of a cap substrate where the cap substrate is bonded to a device substrate upon manufacture of the MEMS device.

According to one aspect of the present invention, for achieving the object, there is provided a method of manufacturing MEMS devices, comprising the steps of forming MEMS device bodies in a first substrate, defining concave portions around the MEMS device bodies over the first substrate, forming convex portions coincident with the concave portions in a second substrate, fitting the convex portions in the concave portions, respectively, to join the first substrate and the second substrate to each other, thereby forming a third substrate, sticking the third substrate on a UV sheet on the second substrate side, and dicing the third substrate to separate the MEMS device bodies from one another.

According to the present manufacturing method, since the convex portions are provided, as a thick film section, in the second substrate that covers the MEMS device bodies, the average thickness can be ensured over the entire second substrate and hence its hand ring strength can be improved. By fitting the convex portions of the second substrate in the concave portions of the first substrate and absorbing the heights of the convex portions of the second substrate into the depths of the concave portions of the first substrate, the total thickness of the post-bonding first and second substrates can be reduced. That is, according to the manufacturing method, it is possible to make compatible both ensuring of the hand ring strength of the second substrate and a reduction in the thickness of each MEMS device due to the reduction in the total thickness of the post-bonding first and second substrates.

The above and further objects and novel features of the invention will more fully appear from the following detailed description appended claims and the accompanying drawings.

BRIEF DESCRIPTION OF THE DRAWINGS

FIG. 1 shows a device substrate according to a first embodiment of the present invention, wherein

FIG. 2 illustrates a cap substrate, wherein

FIG. 3 is a view for describing a method of manufacturing acceleration sensors according to the first embodiment;

FIG. 5 shows a device substrate according to a second embodiment of the present invention, wherein

FIG. 6 is a view for describing a method of manufacturing acceleration sensors according to the second embodiment.

DETAILED DESCRIPTION OF THE PREFERRED EMBODIMENTS

Preferred embodiments of the present invention will hereinafter be described in detail with reference to the accompanying drawings.

First Preferred Embodiment

Figure 4:
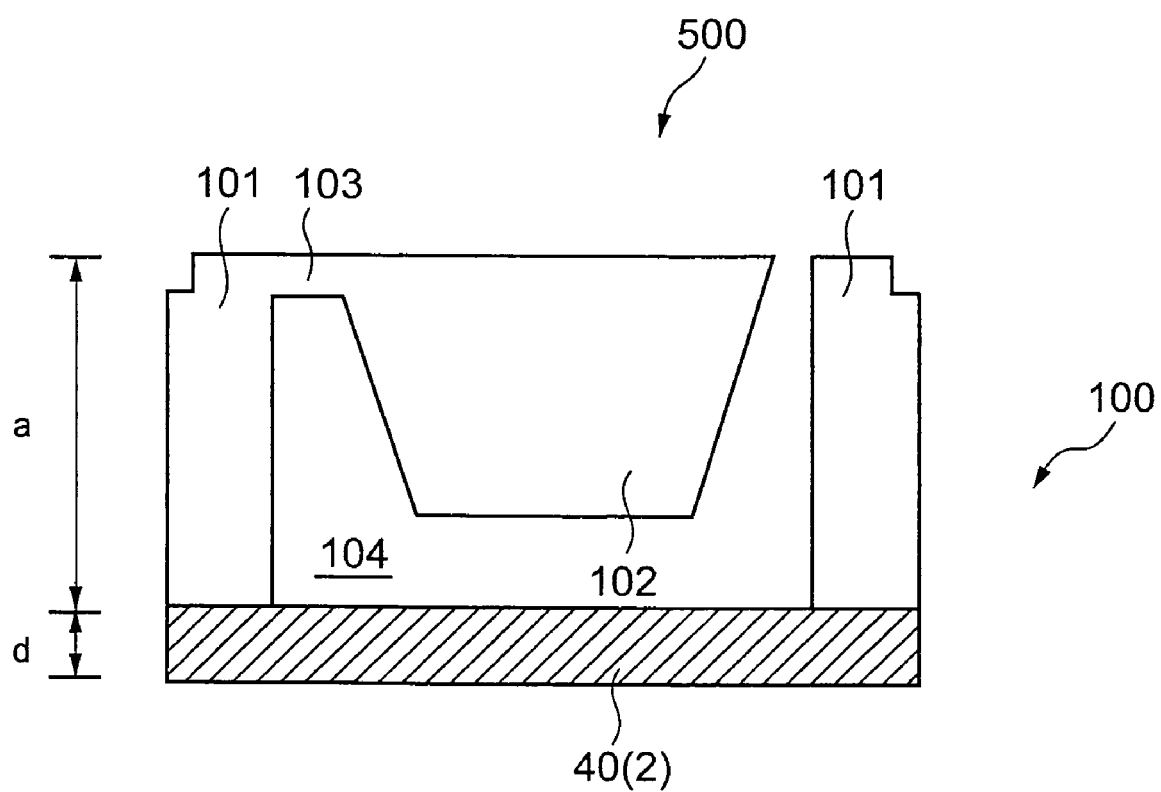
FIG. 4 is a cross-sectional view showing an acceleration sensor according to the first embodiment.

In the preset embodiment, an acceleration sensor 500 shown in FIG. 4 is manufactured using a device substrate 1 shown in FIG. 1 and a cap substrate 2 shown in FIG. 2.

[Configuration of Device Substrate]

Figure 1A:
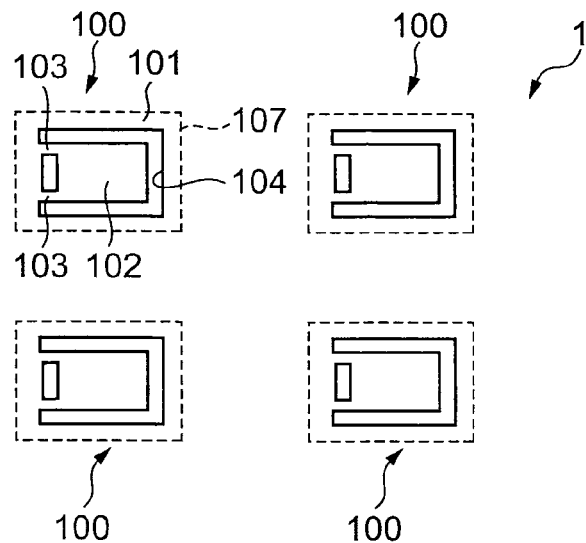
FIG. 1(a) is a plan view thereof.
Figure 1B:
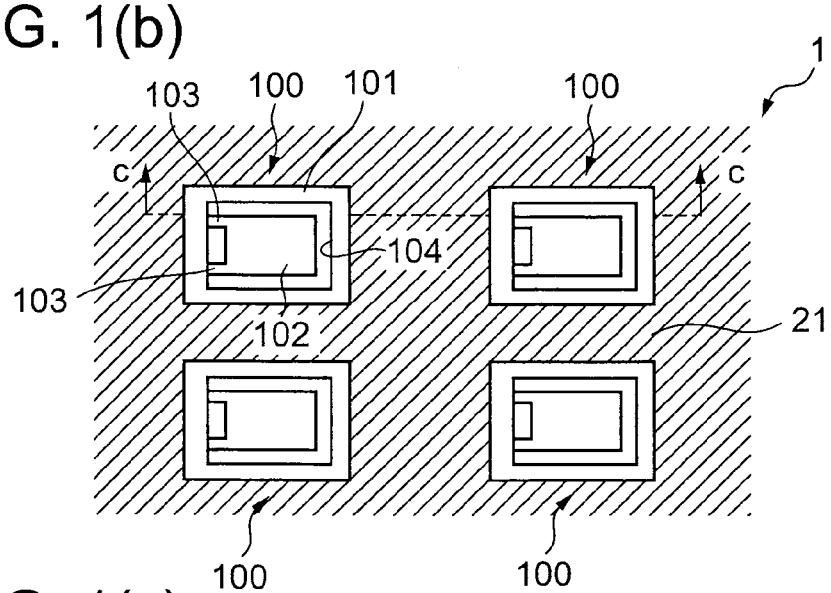
FIG. 1(b) is a back view thereof.
Figure 1C:
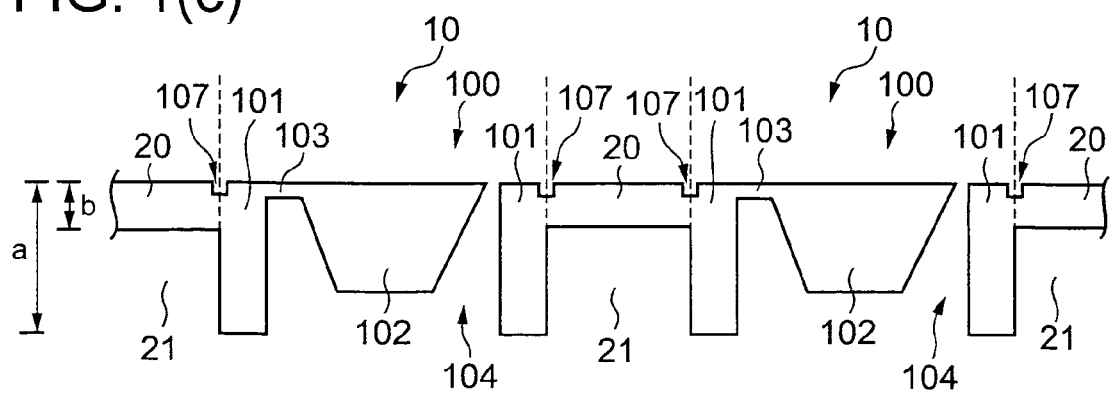
FIG. 1(c) is a cross-sectional view thereof respectively.

FIG. 1 shows the device substrate 1 according to the first embodiment, wherein FIG. 1(a) is a plan view thereof, FIG. 1(b) is a back view thereof, and FIG. 1(c) is a cross-sectional view thereof respectively. The device substrate 1 has a first surface and a second surface opposite to each other. The plan view of FIG. 1(a) is a partly enlarged view of the device substrate 1 at the first surface thereof, and the back view of FIG. 1(b) is a partly enlarged view of the device substrate 1 at the second surface thereof. The cross-sectional view of FIG. 1(c) is a sectional view taken along line c-c of FIG. 1(b).

The device substrate 1 is a silicon substrate, for example, and includes thick film sections 10 each formed with an acceleration sensor body 100, and thin film sections 20 each formed with a concave portion 21.

The acceleration sensor body 100 is formed in the thick film section 10 and includes a peripheral portion 101, a weight portion 102, beam portions 103 and an opening 104. The peripheral portion 101 is shaped in the form of a square frame. The opening 104, which penetrates from the first surface to the second surface, is defined inside the peripheral portion 101. The weight portion 102 is placed in the opening 104 and supported by the peripheral portion 101 elastically and in cantilever manner through the two beam portions 103. The weight portion 102 is substantially rectangular as viewed in the plane and formed narrow on the second surface side rather than on the first surface side. The thin film section 20 is formed thinner than the thick film section 10 due to the formation of the concave portion 21. As shown in FIG. 1(b), the concave portions 21 are respectively formed among the plurality of acceleration sensor bodies 100 and formed around the acceleration sensor bodies 100. Each of trenches used as scribe lines 107 is formed at the boundary between the thick and thin film sections 10 and 20 in the first surface.

The silicon substrate is subjected to photolitho/etching to form the acceleration sensor bodies 100, the concave portions 21 and the scribe lines 107, whereby the device substrate 1 is formed.

[Cap Substrate]

Figure 2A:
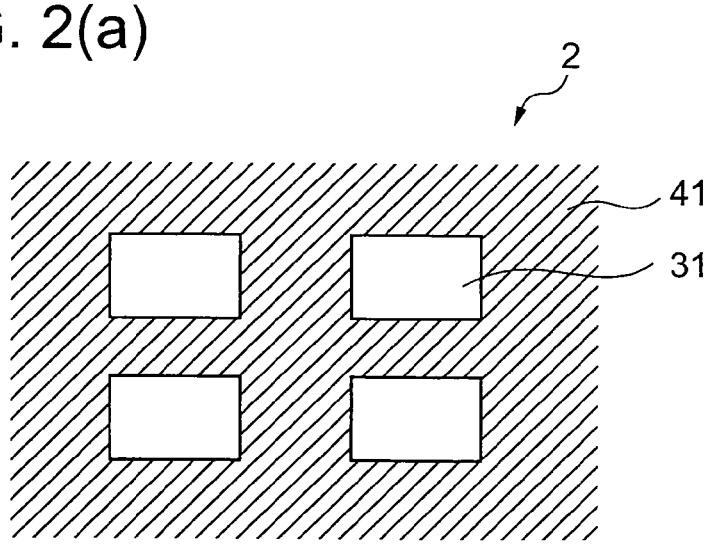
FIG. 2(a) is a plan view thereof and FIG. 2(b) is a cross-sectional view thereof respectively.
Figure 2B:
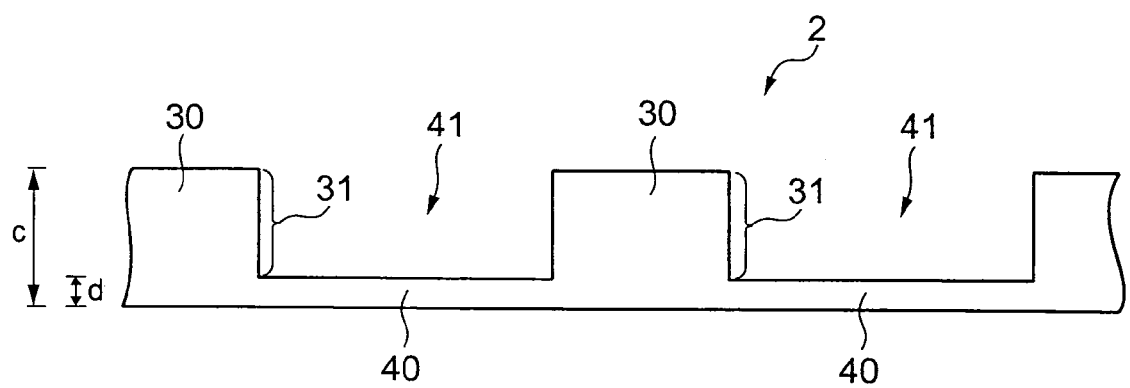

FIG. 2 is a plan view (FIG. 2(a)) of the cap substrate 2 and a cross-sectional view (FIG. 2(b)) thereof. The cap substrate 2 has a third surface and a fourth surface opposite to each other. The plan view of FIG. 2(a) is a partly enlarged view of the cap substrate 2 as viewed in the third surface. In FIG. 2(b), the surface in which convex portions 31 and concave portions 41 are formed, corresponds to the third surface, and the surface opposite to the third surface corresponds to the fourth surface.

The cap substrate 2 is of a glass substrate or a silicon substrate, for example, and includes thick film sections 30 formed with the convex portions 31 and thin film sections 40 formed with the concave portions 41. As the glass substrate, boron silicate glass (Pyrex (registered trademark) glass) is used. Each of the concave portions 41 is shaped in the form and size coincident with those of each of the concave portions 21 defined in the device substrate 1 shown in FIG. 1. The glass substrate or the silicon substrate is subjected to a photolithography and etching process to form the concave portions 41 and the convex portions 31, whereby the cap substrate 2 is formed.

Assuming now that the thickness of the thick film section 10 is defined as a and the thickness of the thin film section 20 is defined as b in FIG. 1(c), the depth of each concave portion 21 results in a−b. On the other hand, assuming that thickness of the thick film section 30 is defined c and the thickness of the thin film section 40 is defined as d, the height of each convex portion 31 becomes c−d. The concave portion 21 and the convex portion 31 are configured in such a manner that the depth a−b of the concave portion 21 and the height c−d of the convex portion 31 coincide with each other and the convex portion 31 is perfectly fitted in the concave portion 21.

The thickness will be explained by way of example. Assuming that the thickness of the thick film section 10 of the device substrate 1 is defined as a=500 μm, the thickness of the thin film section 20 is defined as b=100 μm, the thickness of the thick film section 30 of the cap substrate 2 is defined as c=500 μm, and the thickness of the thin film section 40 is defined as d=100 μm, the depth of the concave portion 21 results in a−b=400 μm and the height of the convex portion 31 results in c−d=400 μm. When the device substrate 1 and the cap substrate 2 are joined to each other such that the convex portions 31 are fitted in their corresponding concave portions 21, the heights of the convex portions 31 are absorbed in their corresponding depths of the concave portions 21 as shown in FIG. 3, and hence the thickness of a bonding substrate 3 formed by bonding the device substrate 1 and the cap substrate 2 to each other is merely increased by the thickness d of the thin film section 40 of the cap substrate 2 from the thickness a of the discrete device substrate 1. That is, the thickness of the bonding substrate 3 results in a+d=500 μm+100 μm=600 μm. Therefore, the thickness of the bonding substrate 3 is increased by the thickness 100 μm of the thin film portion 40 than the thickness 500 μm of the discrete device substrate 1. Thus, the thickness of the bonding substrate 3 can be reduced. That is, when a cap substrate having uniform thickness over its entire surface is bonded to the device substrate 1 (whose thickness is 500 μm), the thickness of the bonding substrate reaches 500 μm+500 μm=1000 μm when, for example, a 500 μm cap substrate is used to maintain hand ring strength of the cap substrate. Thus, the thickness of the cap substrate that maintains the hand ring strength leads to an increase in the thickness of the bonding substrate as it is. On the other hand, when the concave portions 21 of the device substrate 1 are respectively fitted in the convex portions 31 of the cap substrate 2 to join the device substrate 1 and the cap substrate 2 as in the present embodiment, the heights of the convex portions 31 are adsorbed or taken in their corresponding concave portions 21 while the hand ring strength of the discrete cap substrate 2 is being maintained, thereby making it possible to reduce the thickness of the bonding substrate 3.

[Method of Manufacturing Acceleration Sensor]

A method of manufacturing the acceleration sensors 500 using the device substrate 1 and the cap substrate 2 will be explained below.

The device substrate 1 and the cap substrate 2 are formed as described above. Thereafter, as shown in FIG. 3(a), the device substrate 1 and the cap substrate 2 are brought into intimate contact with each other in such a manner that the convex portions 31 of the cap substrate 2 are fitted in their corresponding concave portions 21 of the device substrate 1, and the device substrate 1 and the cap substrate 2 are joined to each other to form the corresponding bonding substrate 3. When the cap substrate 2 is of a silicon substrate, the device substrate 1 and the cap substrate 2 are pressurized and crimped so as to be brought into intimate contact with each other, thereby bonding the device substrate 1 and the cap substrate 2 to each other. When the cap substrate 2 is of a glass substrate, the device substrate 1 and the cap substrate 2 are bonded to each other by anode bonding.

Next, the bonding substrate 3 is fixed to a UV sheet 700 with an adhesive or bonding material 600. Upon fixing of the bonding substrate 3 to the UV sheet 700, the bonding substrate 3 is fixed to the UV sheet 700 at the surface of the cap substrate 2, which is located on the side opposite to the device substrate 1 side (FIG. 3(b)).

The bonding substrate 3 fixed to the UV sheet 700 is diced along the scribe lines 107 to make fractionizing of the acceleration sensors 500 (acceleration sensor bodies 100 and thin film sections of cap substrate 2). Thereafter, ultraviolet light is applied onto the UV sheet 700 to bring the adhesive 600 into polymerization. After the bonding of the bonding substrate 3 onto the UV sheet 700 is released, the respective acceleration sensors 500 are picked up.

FIG. 4 is a cross-sectional view showing the picked-up acceleration sensor 500. The acceleration sensor 500 includes an acceleration sensor body 100 and a thin film section 40 of a cap substrate 2, which is bonded to the bottom face of the acceleration sensor body 100. It is understood that the thickness of the acceleration sensor 500 is merely increased by the thickness d of the thin film section 40 of the cap substrate 2 as compared with the thickness a of the acceleration sensor body 100, and hence the thickness of the acceleration sensor 500 is reduced.

[Operations and Effects]

Since each of the acceleration sensor bodies 100 described in the present embodiment has the opening 104 at the surface (second surface) bonded to the UV sheet 700, the acceleration sensor body 100 has a possibility of being deteriorated upon dicing when the device substrate 1 is directly adhered to the UV sheet 700. That is, firstly, there is a possibility that the residual of silicon will be intruded into the acceleration sensor body 100 upon dicing to degrade the characteristic of the acceleration sensor body 100. Secondly, there is a case in which when the device substrate 1 is directly bonded to the UV sheet 700, the adhesive is adhered to the weight portion 102 and hence the weight portion 102 is not easily separated from the UV sheet 700 when each individualized acceleration sensor body 100 is picked up. In such a case, there is a possibility that excessive stress is applied to the beam portions 103 supporting the weight portions 102, so that the beam portions 103 will be broken down. Thirdly, there is a possibility that the thin beam portions 103 will break due to pressure of water for sweeping or discharging the residual of silicon upon dicing. Thus, since the cap substrate 2 is bonded to the device substrate 1 and the device substrate 1 is fixed to the UV sheet 700 via the cap substrate 2 in the manufacturing method of the acceleration sensors according to the present embodiment, the openings 104 of the acceleration sensor bodies 100 are covered with the cap substrate 2, thereby making it possible to prevent the residual of silicon from being intruded into the acceleration sensor bodies 100, prevent the adhesive from adhering to the weight portions 102 and prevent the beam portions 103 from being broken due to water pressure.

Since the concave portions 41 are defined in the cap substrate 2 and the thin film sections 40 are formed therein, and the convex portions 31 remain therein, the average thickness can be ensured over the entire cap substrate 2, and the hand ring strength of the discrete cap substrate 2 can be ensured. Bonding the device substrate 1 and the cap substrate 2 to each other in the state in which the convex portions 31 of the cap substrate 2 are being fitted in their corresponding concave portions 21 of the device substrate 1 makes it possible to absorb the heights of the convex portions 31 in the depths of the concave portions 21 to reduce the thickness of the bonding substrate 3. Thus, it is possible to make compatible both ensuring of the hand ring strength of the cap substrate 2 and a reduction in the thickness of each acceleration sensor 500.

Second Preferred Embodiment

Figure 5A:
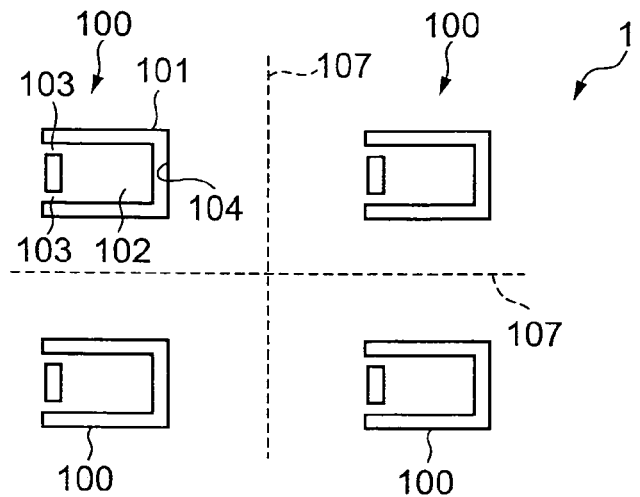
FIG. 5(a) is a plan view thereof.
Figure 5B:
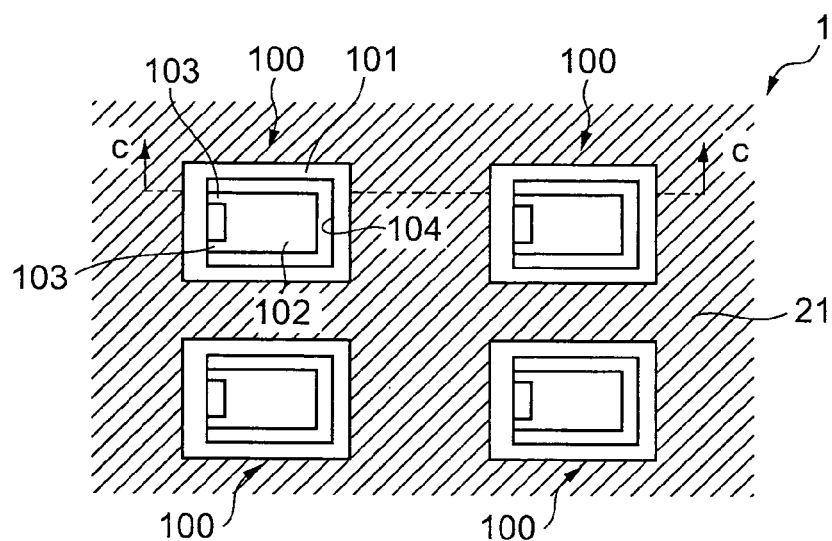
FIG. 5(b) is a back view thereof and FIG. 5(c) is a cross-sectional view thereof respectively.
Figure 5C:
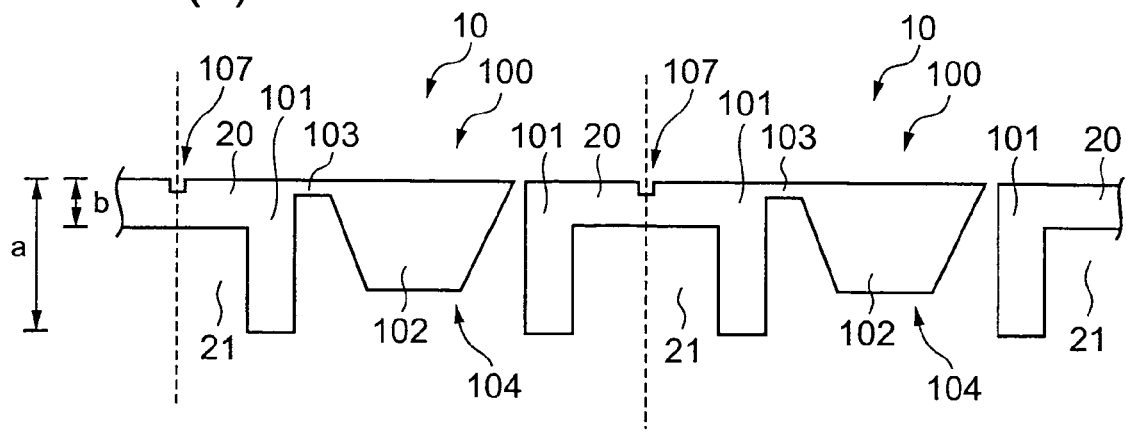

The present embodiment is different from the first embodiment in the position of each scribe line 107 formed on a device substrate 1. While the scribe lines 107 are formed at the boundaries between the thick film sections 10 and the thin film sections 20 in the first embodiment, the scribe lines 107 are formed substantially in the centers of thin film sections 20 and shared between acceleration sensor bodies 100 adjacent to one another as shown in FIGS. 5(*a*) and 5(*b*).

Figure 7:
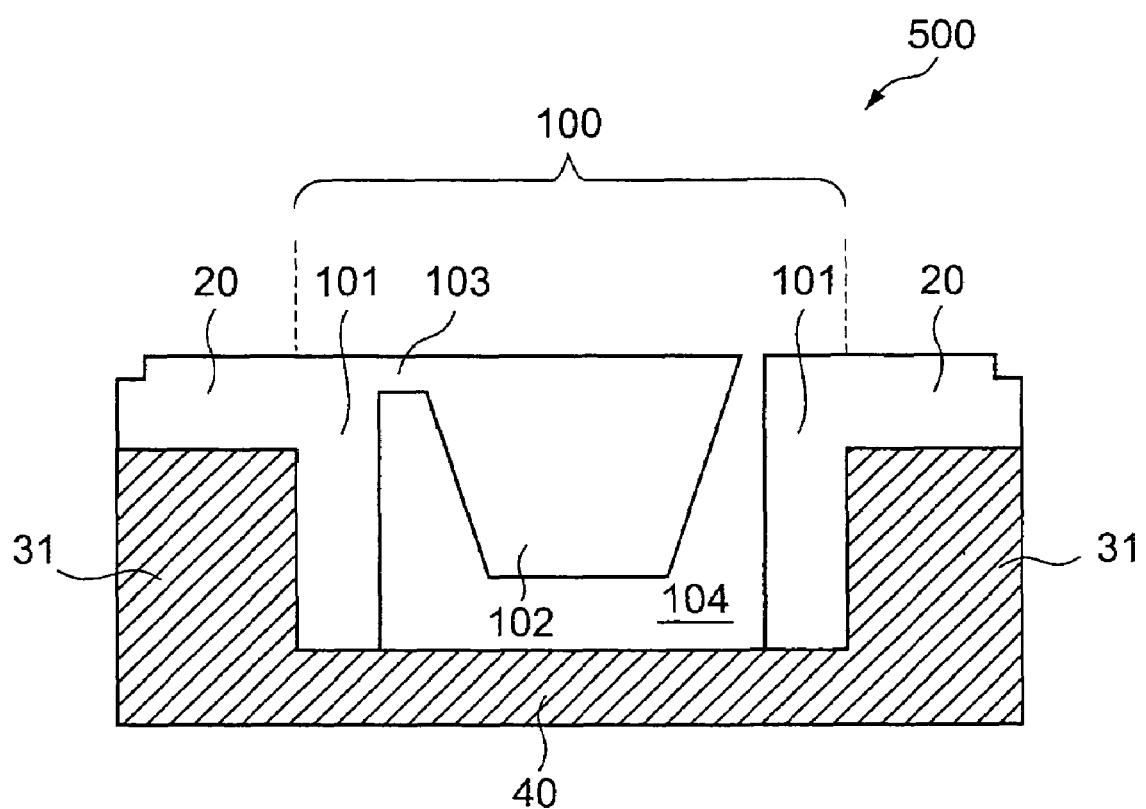
FIG. 7 is a cross-sectional view showing an acceleration sensor according to the second embodiment.

FIG. 6 is a view for describing a method of manufacturing acceleration sensors 500 according to the second embodiment. Since the scribe lines 107 are shared between the adjacent acceleration sensors 500 as shown in the same figure in the present embodiment, the accuracy of processing of each scribe line 107 can be relaxed as compared with the case in which the two scribe lines 107 are formed between the adjacent acceleration sensors 500 as in the first embodiment, and the number of times dicing is carried out can be reduced. FIG. 7 is a cross-sectional view of an acceleration sensor 500 formed using the device substrate 1 according to the present embodiment. The acceleration sensor 500 further includes an outer peripheral section provided around the acceleration sensor 500 according to the first embodiment and comprising part of the thin film section 20 of the device substrate 1 and part of the convex portion 31 of the cap substrate 2. The acceleration sensor 500 according to the present embodiment is made wide by the outer peripheral section as compared with the acceleration sensor 500 according to the first embodiment. Since, however, the scribe lines 107 are shared between the adjacent acceleration sensors 500, the unnecessary portion left between the adjacent acceleration sensors 500 can be avoided.

While the preferred forms of the present invention have been described, it is to be understood that modifications will be apparent to those skilled in the art without departing from the spirit of the invention. The scope of the invention is to be determined solely by the following claims.

What is claimed is:

1. A method of manufacturing MEMS devices, comprising:
   forming MEMS device bodies in a first substrate;
   defining concave portions around the MEMS device bodies in the first substrate;
   forming convex portions in a second substrate, the convex portions positioned to be respectively coincident with the concave portions;
   fitting the convex portions in the concave portions, respectively, to join the first substrate and the second substrate to each other, thereby forming a third substrate;
   sticking the third substrate to a UV sheet on the second substrate; and
   dicing the third substrate to separate the MEMS device bodies from one another,
   wherein the second substrate is a silicon substrate, and
   wherein in said fitting, the first substrate and the second substrate are bonded to each other by crimping.

2. The method according to claim 1, wherein said sticking comprises sticking the third substrate to the UV sheet using an adhesive.

3. The method according to claim 1, wherein said sticking comprises sticking the third substrate to the UV sheet using a bonding material.

4. The method according to claim 1, wherein said dicing comprises dicing the third substrate along scribe lines.

5. The method according to claim 4, wherein the MEMS device bodies have different respective scribe lines adjacent thereto.

6. The method according to claim 4, wherein only a single scribe line is disposed between adjacent MEMS device bodies.

7. The method according to claim 1, further comprising applying ultraviolet light to the UV sheet.

* * * * *